United States Patent
Notani

(10) Patent No.: US 9,209,961 B1
(45) Date of Patent: Dec. 8, 2015

(54) METHOD AND APPARATUS FOR DELAY COMPENSATION IN DATA TRANSMISSION

(71) Applicant: Apple Inc., Cupertino, CA (US)

(72) Inventor: Rakesh L. Notani, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/499,985

(22) Filed: Sep. 29, 2014

(51) Int. Cl.
*H04L 7/00* (2006.01)
*H03L 7/08* (2006.01)
*H03K 5/14* (2014.01)

(52) U.S. Cl.
CPC ............. *H04L 7/0041* (2013.01); *H03K 5/14* (2013.01); *H03L 7/08* (2013.01)

(58) Field of Classification Search
CPC ......... H03L 7/08; H03L 7/193; H03L 7/1976; H04L 7/0041; H04L 7/0008; H04L 25/14; H04L 25/0272; H04L 25/028; H04L 25/0292; H04L 7/002; H04L 12/422; H04L 1/1664; H04L 1/1678; H04L 1/1825; H03K 5/14; H03K 23/66; H03K 19/0016; H03K 23/54; H03K 5/1502

See application file for complete search history.

(56) References Cited

U.S. PATENT DOCUMENTS

| | | | |
|---|---|---|---|
| 7,159,092 B2 | 1/2007 | Johnson et al. | |
| 7,461,287 B2 | 12/2008 | Dreps et al. | |
| 7,752,366 B2 | 7/2010 | Subramanian et al. | |
| 8,347,040 B2 | 1/2013 | Lilly et al. | |
| 2004/0117543 A1* | 6/2004 | Thomann et al. | 711/105 |
| 2006/0107011 A1* | 5/2006 | Nystuen | G06F 13/4234 711/167 |
| 2006/0184817 A1* | 8/2006 | Dreps et al. | 713/503 |
| 2007/0033337 A1* | 2/2007 | Butt et al. | 711/105 |
| 2009/0129179 A1* | 5/2009 | Yamazaki | 365/194 |
| 2010/0019822 A1* | 1/2010 | LaBerge | G06F 1/12 327/291 |
| 2012/0194248 A1* | 8/2012 | Magee | G11C 7/04 327/262 |
| 2013/0064025 A1* | 3/2013 | Chen et al. | 365/193 |
| 2014/0293718 A1* | 10/2014 | Prakash et al. | 365/193 |
| 2014/0347941 A1* | 11/2014 | Jose et al. | 365/191 |
| 2015/0029800 A1* | 1/2015 | Iijima | H03K 19/0016 365/193 |
| 2015/0089164 A1* | 3/2015 | Ware | G11C 5/02 711/149 |

FOREIGN PATENT DOCUMENTS

| | | |
|---|---|---|
| CA | 2249250 | 4/1999 |
| KR | 100442967 | 7/2004 |

* cited by examiner

*Primary Examiner* — Hirdepal Singh
(74) *Attorney, Agent, or Firm* — Meyertons, Hood, Kivlin, Kowert & Goetzel, P.C.; Erik A. Heter

(57) ABSTRACT

A method and apparatus for delay compensation in data transmission is disclosed. In one embodiment, an IC is configured to transmit data along with a clock signal to which the data is synchronized at the receiver. The IC includes a delay circuit configured to receive the data, which is transmitted in beats. The delay circuit includes a number of pipelines corresponding to the number of beats. Beats of data input into the delay circuit are routed to particular ones of the pipelines in accordance with a desired amount of delay. The delay applied to the data may be set to align the data with the clock signal at the receiver and to compensate for inherent delays that affect the clock signal.

16 Claims, 6 Drawing Sheets

METHOD AND APPARATUS FOR DELAY COMPENSATION IN DATA TRANSMISSION

BACKGROUND

1. Technical Field

This disclosure is directed to integrated circuits (ICs), and more particularly, to delay compensation in data transmissions that occur in ICs.

2. Description of the Related Art

In computers and other electronic systems, data is often transmitted synchronous with a clock signal. For example, data to be written to a memory may be sent from an IC to a memory on another chip along with a clock signal. In another example, data may be transferred within an IC, from a processor core to an on-chip memory, along with a clock signal. During such data transfers, inherent delays in the signal paths for both the data and clock signals can cause timing mismatches at the receiver. Accordingly, compensation circuitry is often provided at the receiver in order to apply delays to ensure data is properly captured.

One common type of circuit used for implementing delays to compensate for timing mismatches is the delay locked loop (DLL). For example, a DLL may be used to delay a clock signal. The delay may be set such that the clock signal changes states relative to the data such that proper setup and hold time requirements are observed at the receiver.

SUMMARY

A method and apparatus for delay compensation in data transmission is disclosed. In one embodiment, an IC is configured to transmit data along with a clock signal to which the data is synchronized at the receiver. The IC includes a delay circuit configured to receive the data, which is transmitted in beats. The delay circuit includes a number of pipelines corresponding to the number of beats. Beats of data input into the delay circuit are routed to particular ones of the pipelines in accordance with a desired amount of delay. The delay applied to the data may be set to a desired alignment between the data and the clock signal at the receiver and to compensate for inherent delays that affect the clock signal.

In one embodiment, a system includes a memory controller and a memory coupled to receive data from the memory controller. The memory controller includes a physical layer that includes the delay circuit. The memory controller may also include clock generation circuitry configured to generate the clock signal (sometimes referred to as a data strobe signal) that is transmitted with the data. The memory may include clocked storage circuitry used for initial receipt of the data transmitted from the memory controller, with the clocked storage circuitry being synchronized to data strobe signal. The data strobe signal may be subject to a delay (known as an insertion delay) at the memory due to various factors, such as its fan out to the various clocked storage circuits. This delay may be compensated for, at least in part, by delaying the data using the delay circuit.

The memory controller may also include clock generation circuitry that includes one or more delay locked loops (DLLs). One of the DLLs may be used to generate the data strobe signal based on another clock signal received thereby. The alignment at the memory between the data and the data strobe signal may be adjusted in part by adjusting a delay applied by the DLL that generates the data strobe signal. The adjustment of the delay applied by the DLL may be limited in order to prevent setup and/or hold time violations in the clocked storage circuits of the memory. Thus, the delay circuit may be used to apply delay to the data to provide additional compensation for the insertion delay.

BRIEF DESCRIPTION OF THE DRAWINGS

The following detailed description makes reference to the accompanying drawings, which are now briefly described.

Figure 1:
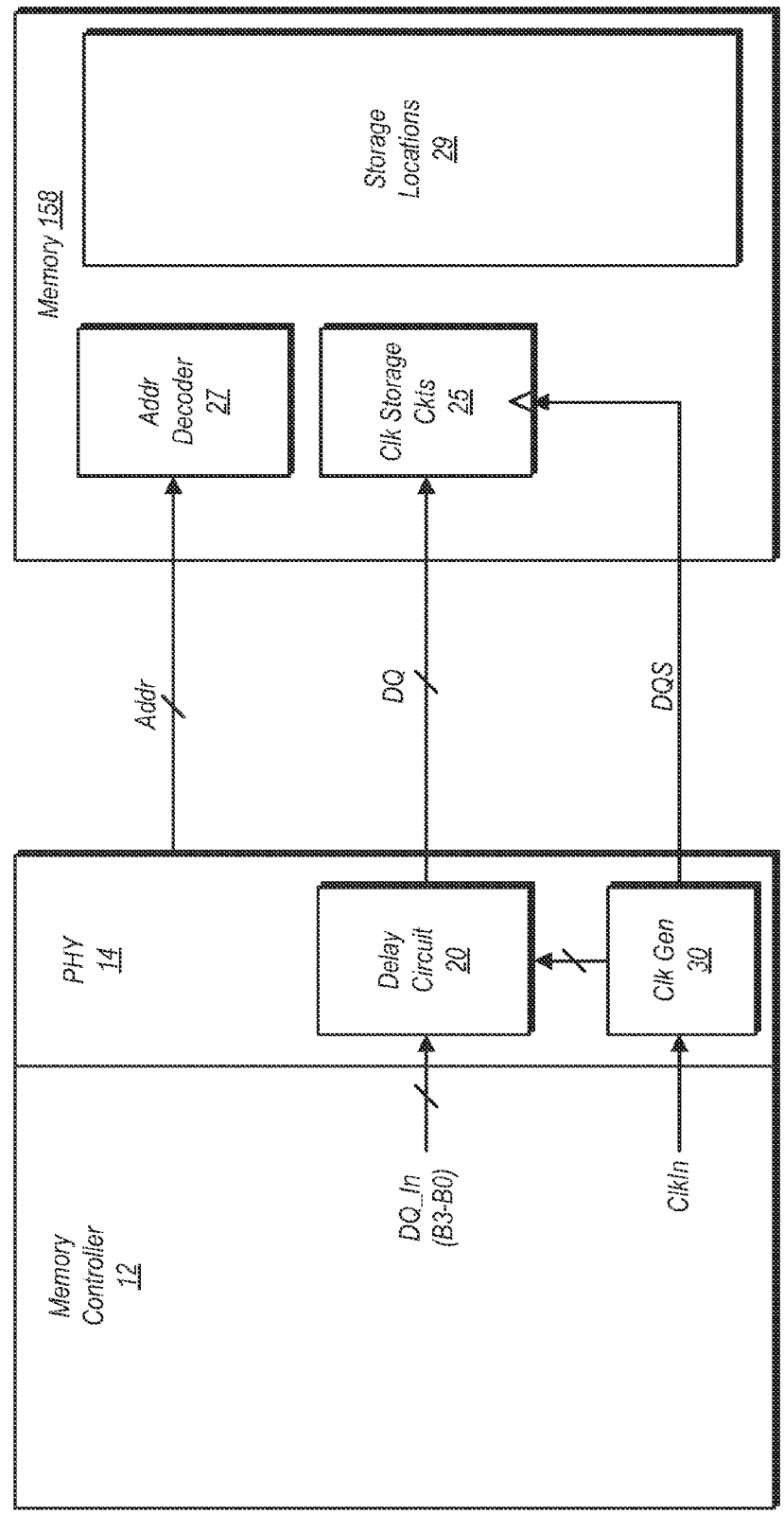
FIG. 1 is a block diagram of one embodiment of a system including a memory controller and a memory.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

Turning now to FIG. 1, a block diagram of a system having a memory controller and a memory is shown. In the embodiment shown, system 5 includes a memory controller 12 and a memory 158. The memory controller 12 includes a physical layer 14 which is used for interfacing with memory 158.

Memory 158 includes an address decoder 27, a number of clocked storage circuits 25, and a number of storage locations 29.

Physical layer 14 includes a delay circuit 20 and a clock generation circuit 30. Delay circuit 20 in the embodiment shown is coupled to receive data from other circuitry in the memory controller and provide a delay thereto before its transmission to memory 158. In this particular embodiment, the data may be transferred in beats. For example, a 32-bit data word may be transmitted in four beats of eight bits each. Accordingly, the data input (DQ_In) of delay circuit 20 is configured to receive four beats of data, B3-B0, in this particular embodiments. It is noted that transmission of data in beats is not required for all embodiments falling within the scope of this disclosure, and further noted that the number of beats, bits per beat, and bits per data word may be different than the example given here.

Clock generation circuit 30 in the embodiment shown is coupled to receive a clock signal, ClkIn, that is distributed via a clock tree that runs in part through memory controller 12. Based on the received clock signal, clock generation circuit 30 may generate a number of different clock signals. Among the generated clock signals is the data strobe signal DQS that is transmitted to memory 158 along with the data. A number of additional clock signals may generated and transmitted to delay circuit 20, the operation of which is explained in further detail below.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation.

Also included in memory 158 are clocked storage circuits 25. In various embodiments, these circuits may be implemented as flip-flops or latches. The clocked storage circuits 25 may be used to initially receive data from memory controller 12 for write operations. The data reception operations in the clocked storage circuits 25 may be synchronized to the data strobe signal, DQS. In one embodiment, memory 158 may be a double data rate (DDR) memory, and thus the clocked storage circuits may be responsive to both the rising and falling edges of the data strobe signal. It is noted however that embodiments that are not DDR memories may also fall within the scope of this disclosure.

The data strobe signal received in memory 158 may be subject to inherent delays. For example, since the data strobe signal is fanned out to multiple clocked storage circuits, a delay known as an insertion delay may occur. Since the clock edges of the data strobe signal are used to validate data received from memory controller 12 when received by clocked storage circuit 25, it is important that setup and hold time requirements are observed. The insertion delay to which the data strobe signal is subject may cause setup and/or hold time violations if no compensation is provided. In the embodiment shown, such compensation may be provided by delay circuit 20 and one or more delay locked loops (DLLs) in clock generation circuit 30. More particularly, the delay circuit 20 shown herein may provide for coarse delay adjustment, while at least one DLL in clock generation circuit 30 may be used for fine delay adjustment. By adjusting the delays in this manner, the transitions of the data strobe signal may occur with sufficient setup and hold time such that the data is properly interpreted.

Figure 2:
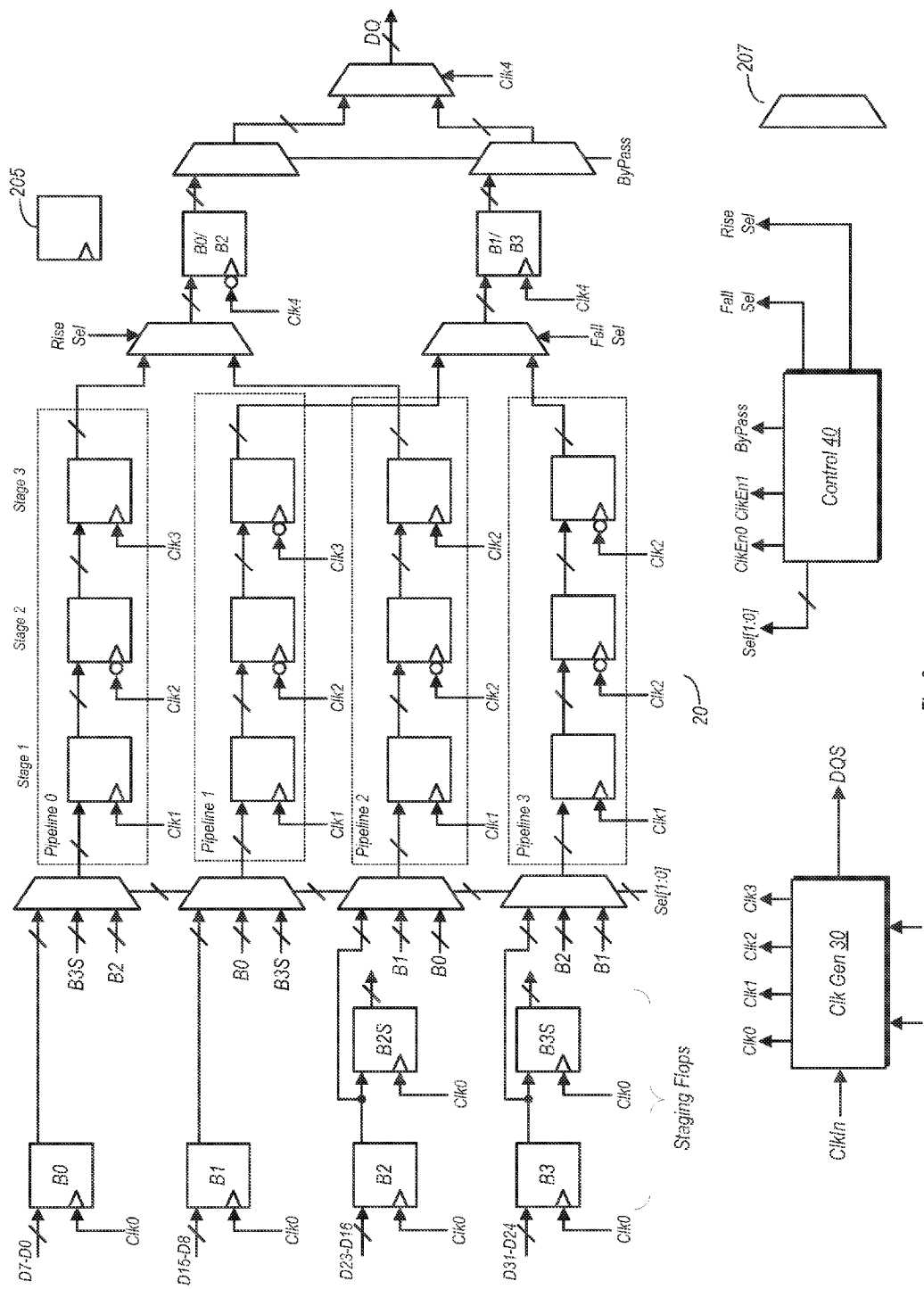
FIG. 2 is a schematic diagram of one embodiment of a delay circuit.

FIG. 2 is a schematic diagram of one embodiment of a delay circuit. In the embodiment shown, delay circuit 20 includes a number of clocked storage circuits 205 which are coupled to receive data. It is noted that in the embodiment shown, each clocked storage circuit is depicted as being eight bits wide. However, these clocked storage circuits 205 could also be considered to be eight instances of a single-bit wide storage circuit (such as a D-flip flop or latch). Furthermore, the data width shown here is considered to be exemplar and is thus not limiting. It is further noted that clocked storage circuits 205 having a bubble on their respective clock inputs are considered to be responsive to the falling edge of their respectively received clock signal. Those instances of clocked storage circuit 205 that do not include a bubble on their respective clock inputs are considered to be responsive to the rising edge of their respectively received clock signals.

A number of the clocked storage circuits 205 used in the illustrated embodiment of delay circuit 205 are implemented as staging flops. Staging flops B0, B1, B2, and B3 in the embodiment shown are coupled to receive data from other circuitry in memory controller 12 (e.g., data encoding circuitry). Staging flops B2S and B3S are coupled to receive data from staging flops B2 and B3 one clock cycle later. The clock signal received by each of the staging flops, Clk0, is generated by clock generation circuit 30, which is discussed in greater detail below.

Delay circuit also includes a number of selection circuits 207 and a number of pipelines (Pipeline 0-Pipeline 3). On the input side, the selection circuits 207 are coupled to receive inputs from various ones of the staging flops. For example, the upper most selection circuit 207 in the drawing is coupled to the outputs of staging flops B0, B3S, and B2. The output of the upper most selection circuit 207 is coupled to the input of a clocked storage circuit 205 in Pipeline 0. Depending on the selection made by each of the selection circuits 207 on the input side, the data may be delayed by zero clock cycles, one half clock cycle, or one full clock cycle. When the data is delayed by zero clock cycles, the data beats output from staging flops B0, B1, B2, and B2 are routed into Pipelines 0, 1, 2, and 3, respectively. When data is delayed by one half clock cycle, the data beats output from staging flops B3S, B0, B1, and B2 are routed into Pipelines 0, 1, 2, and 3, respectively. When data is delayed by one full clock cycle, data beats output from staging flops B2, B3S, B0, and B1 are routed into Pipelines 0, 1, 2, and 3, respectively. The selection signals, Sel[1:0], are generated by and provided from control circuit 40 in the embodiment shown. The source of these and other control signals may vary from one embodiment to another.

Data may progress through the pipelines according to clock signals received by the various clocked storage circuits 205. Each of the clocked storage circuits 205 in stage 1 of their respective pipelines is coupled to receive the clock signal Clk1, and is responsive to the rising edge thereof. Each of the clocked storage circuits 205 in stage 2 of their respective pipelines is coupled to receive the clock signal Clk2, and is responsive to the falling edge thereof. The clocked storage circuits 205 in stage 3 of Pipelines 0 and 1 are coupled to receive the clock signal Clk3, with the former being responsive to the rising edge while the latter is responsive to the falling edge. The clocked storage circuits 205 in stage 3 of pipelines 2 and 3 are coupled to receive the clock signal Clk2, with the former being responsive to the rising edge and the latter being responsive to the falling edge.

On the output side of Pipelines 0-3, additional instances of selection circuit 207 are provided. A first of these selection circuits 207 includes inputs coupled to the outputs of Pipelines 0 and 2. The selection signal, Rise Sel, causes selection of Pipeline 0 when low and Pipeline 2 when high in this embodiment. The data beat from the selected output is routed to the clocked storage circuit 205 labeled B0/B2, which is responsive to the falling edge of the clock signal Clk4.

A second selection circuit 207 on the output side includes inputs coupled to the outputs of Pipelines 1 and 3. The selection signal for this selection circuit 207, Fall Sel, is configured to cause selection of Pipeline 1 when low and Pipeline 3 when high in this embodiment. The data beat from the selected output is routed to the clocked storage circuit 205 labeled B1/B3, which is responsive to the rising edge of the clock signal Clk4.

The outputs of B0/B2 and B1/B3 are routed through bypass selection circuits 207. When the bypass signal is asserted, no data passes through is conveyed through these selection circuits. Otherwise, when the bypass signal is de-asserted, the output from these flops is passed to a final selection circuit 207. The final selection circuit 207 is coupled to receive Clk4 as its selection input. When Clk4 is low, the data beat most recently output from B0/B2 is selected and passed onto the data bus DQ. When Clk4 is high, the data beat most recently output from B1/B3 is selected and passed onto the data bus DQ.

Control circuit 40 in the embodiment shown is configured to assert various control signals provided to delay circuit 20. Among these signals are the Sel[1:0], Rise Sel and Fall Sel signals. Depending on the state of Sel[1:0], control circuit 40 may cause the data passed through delay circuit 20 to be adjusted in increments of one half clock cycle. Furthermore, assertion and de-assertion of the Rise Sel and Fall Sel signals may cause the pipelines to be selected in a predetermined sequence to output the data beats in sequence. In this particular embodiment, data from beat 0 (B0, comprising bits D7:D0) is selected first, followed by data from B1, B2, and then B3. When the selected delay is zero clock cycles, the sequence of pipeline selection for output to data bus DQ is Pipeline 0, 1, 2, and 3. One the selected delay is one half clock cycle, the sequence of pipeline selection is Pipeline 1, 2, 3, and 0. When the selected delay is one full clock cycle, the sequence of pipeline selection is Pipeline 2, 3, 0, and 1.

While beats of data are transmitted from beats containing the bits of least significance to beats containing the bits of most significance in this particular embodiment, it is noted that this sequence is not intended to limit the disclosure. For example, embodiments in which the beat containing the bits of most significance are transmitted first followed by those of lesser significance are also possible and contemplated.

Figure 3:
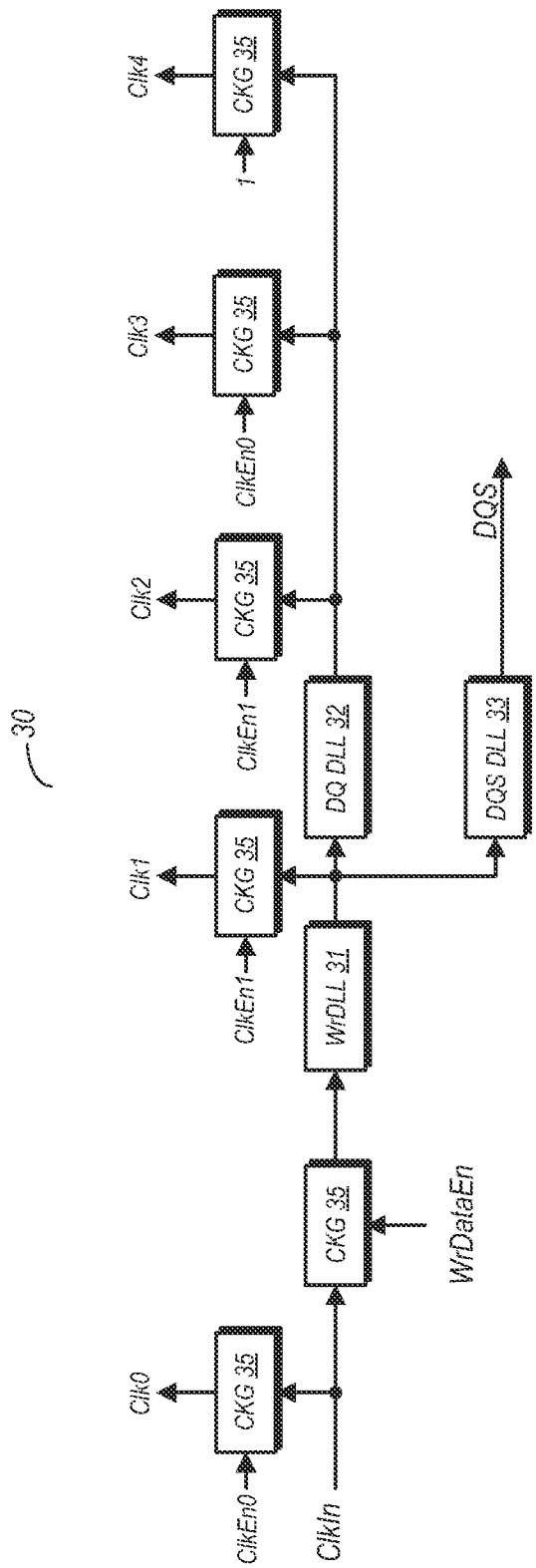
FIG. 3 is a block diagram of one embodiment of a clock generation circuit.

Control circuit 40 is also configured to assert and de-assert the ClkEn0 and ClkEn1 signals, which are provided to clock generation circuit 30. These signals (which are provided to clock gating circuits as shown in FIG. 3) are alternately asserted and de-asserted to alternately enable and disable their respectively coupled clock gating circuits. This may have the effect of providing an extra clock of hold time for each data beat so as to prevent hold time violations.

Turning now to FIG. 3, one embodiment of a clock generation circuit 30 used with delay circuit 20 is shown. In the embodiment shown, clock generation circuit 30 is configured to receive a clock signal, ClkIn, which is distributed from a clock tree that includes branches within memory controller 12. The input clock signal is received by two different clock gating circuits 35. A first of these clock gating circuits 35 is configured to output the clock signal Clk0 when ClkEn0 is asserted. A second clock gating circuit 35 is configured to convey the input clock signal to the write level DLL (WrDLL) 31 when the write data enable (WrDataEn) is asserted. The write data enable signal may be de-asserted when no write operations are desired.

As previously noted, the delay circuit 20 may be used to provide coarse-grain delay adjustment for aligning the data strobe signal with the data as received at memory 158. In this particular embodiment, WrDLL 31 may provide the fine-grain delay adjustment for aligning the data strobe signal with the data in additional to adjusting the timing of clock signals Clk1-Clk4. The input clock signal provided to WrDLL 31 may be varied by a phase shift of up to 90° in the embodiment shown. Beyond this amount, the possibility of hold time violations increases, and as such, coarse-grain delay adjustment is performed. Furthermore, the presence of delay circuit 20 enables smaller adjustments to WrDLL 31 even if hold time violations are not otherwise introduced.

The output of WrDLL 31 is provided to another clock gating circuit 35 (which is also coupled to receive ClkEn1 and outputs Clk1), DQ DLL 32, and DQS DLL 33. The output of DQ DLL is provided to clock gating circuits 35 that receive ClkEn1, ClkEn0, and hardwired logic 1, and output Clk2, Clk3, and Clk4, respectively. As previously noted, ClkEn0 and ClkEn1 may be alternately asserted and de-asserted to introduce an extra clock of hold time to each of the data beats in order to ensure that there are no hold time violations.

DQ DLL 32 and DQS DLL 33 in the embodiment shown introduce phase shifts of up to plus and minus 90° to the received clock signal, respectively, with the latter outputting the data strobe signal DQS. It is noted that the delay of WrDLL 31, DQ DLL 32, and DQS DLL 33 may be adjusted by signals from control circuit 40 or another source. Furthermore, while it is noted that WrDLL 31 is used for fine-grain adjustments to the delay (and thus the alignment of DQS and the data) in this embodiment, other embodiments are possible and contemplated where the other DLLs are also use for such fine-grain adjustments.

Figure 4:
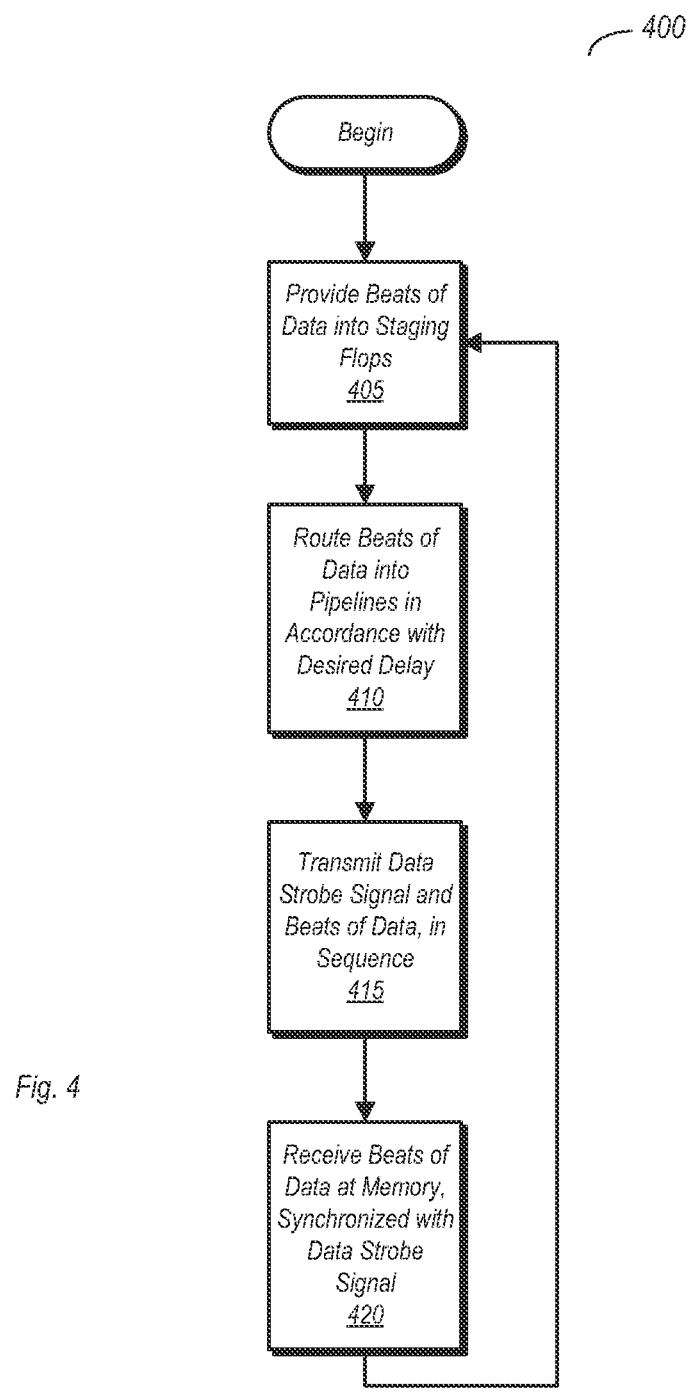
FIG. 4 is a flow diagram illustrating one embodiment of a method for aligning data and a data strobe signal.

Turning now to FIG. 4, a flow diagram illustrating one embodiment of a method for aligning data and a data strobe signal is shown. Method 400 as shown herein may be performed with various embodiments of the circuitry discussed above. Furthermore, hardware embodiments not explicitly discussed herein that are capable of performing method 400 are also possible and contemplated.

Method 400 begins with the providing of beats of data into staging flops of a delay circuit (block 405) such as that shown in FIG. 2. The data, which is to be written to a memory, may be provided from data encoding circuitry or another source within a memory controller. Based on a desired alignment between the beats of data and the data strobe signal at the memory in which it is received, the beast of data may be routed into selected pipelines in order to introduce a desired delay (block 410). In embodiments such as that shown above, the delay introduced may be in increments of one half clock cycle.

Data may propagate through the delay circuit and then be transmitted in a predetermined sequence, along with the data strobe signal (block 415). The beats of data may be received at the memory and synchronized with the data strobe signal in clocked storage circuitry (block 420). Thereafter, method 400 returns to block 405.

Figure 5:
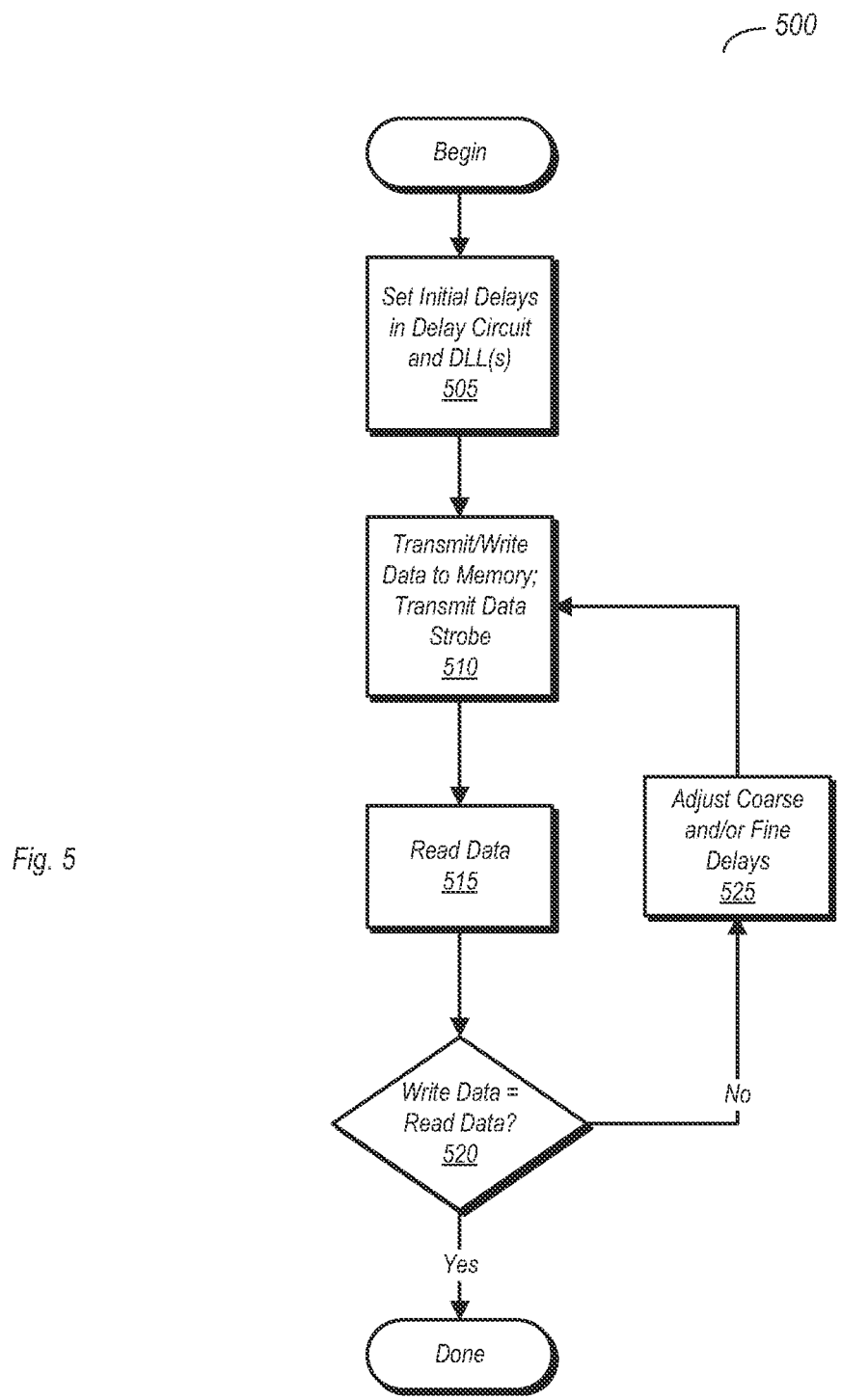
FIG. 5 is a flow diagram illustrating one embodiment of a method for conducting a training procedure for writing data to a memory.

FIG. 5 is a flow diagram illustrating one embodiment of a method for conducting a training procedure for writing data to a memory. As with the method discussed above in reference to FIG. 4, method 500 shown in FIG. 5 may be performed on various embodiments of the hardware discussed above as well as embodiments not explicitly discussed herein.

Method 500 begins with the setting of initial delays in a delay circuit and in one or more DLLs (block 505). For example, the delay a delay circuit such as that discussed above may be set to zero clock cycles, while the DLL to be adjusted may be set at some nominal delay value. Thereafter, data and a data strobe signal may be transmitted to the memory, with the data being subsequently written thereto (block 510). After the write operation is complete, a read operation may be performed (block 515). Subsequent to the read operation, the data read from memory may be compared with the data written thereto. If the read data and write data match (block 550, yes), then no further adjustments to the delay are needed. If on the other hand, the read data and write data do not match (block 520, no), then adjustments may be made to the coarse delay, the fine delay, or both (block 525).

Using the circuit embodiments discussed above, the coarse delay may be adjusted by re-routing the beats of data to different pipelines, thereby changing the coarse delay in increments of one half clock cycle. The DLL (e.g., WrDLL 31 in FIG. 3) may adjust the delay in smaller increments. After adjustments to the delay have been made, the method may return to block 510 and another write/read cycle may be performed, along with a subsequent comparison of write data to read data. The cycle may repeat as many times as necessary until the data written to the memory matches that which is subsequently read therefrom.

Figure 6:
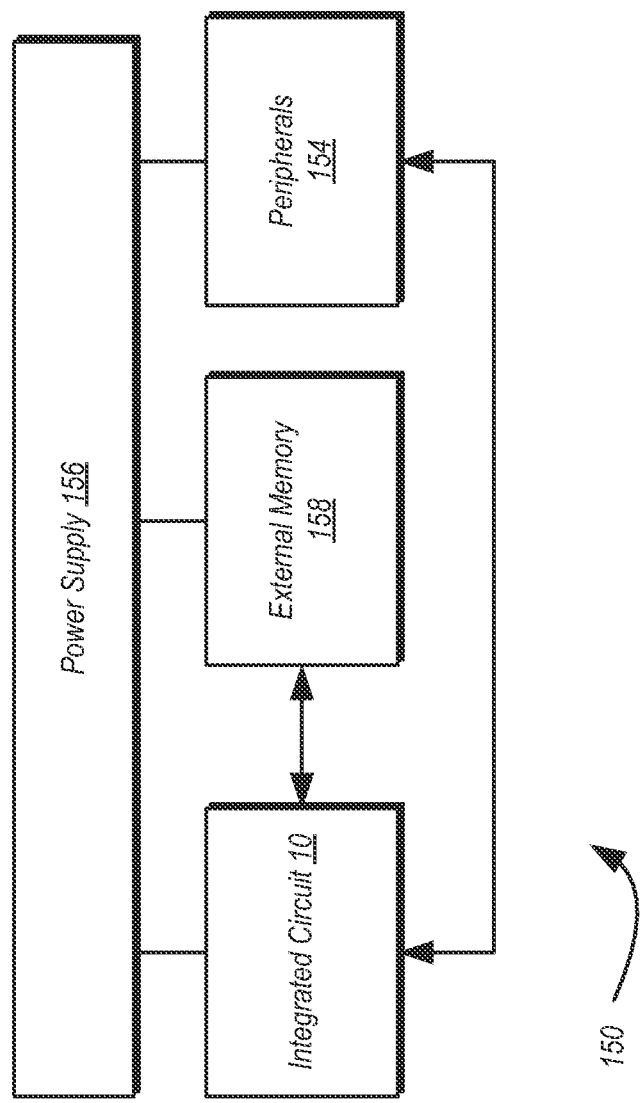
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   clock generation circuitry configured to transmit a first clock signal, wherein the clock generation circuitry is configured to generate a plurality of clock signals including the first clock signal;
   a delay circuit configured to delay data transmitted with the first clock signal, the delay circuit comprising:
      a plurality of staging flops, wherein each staging flop is configured to receive data corresponding to one of a plurality of beats;
      a plurality of pipelines each having a plurality of clocked storage circuits;
      a first plurality of selection circuits coupled between the plurality of staging flops and the plurality of pipelines, wherein the plurality of selection circuits are configured to route data from selected ones of the plurality of staging flops into correspondingly coupled ones of the plurality of pipelines, wherein an amount of delay applied to a given beat of data is dependent upon which of the plurality of pipelines to which it is routed; and
      a second plurality of selection circuits, wherein the second plurality of selection circuits is configured to select each of the pipelines in sequence to output one beat of data for each cycle of the first clock signal;
   wherein the clock generation circuitry is coupled to provide selected ones of the plurality of clock signals to corresponding ones of the plurality of clocked storage circuits in each of the plurality of pipelines.

2. The integrated circuit as recited in claim 1, further comprising a control circuit to cause the first plurality of selection circuits to route data from selected ones of the plurality of staging flops into correspondingly coupled ones of the plurality of pipelines based on a desired alignment between the data and the first clock signal.

3. The integrated circuit as recited in claim 1, wherein the clock generation circuitry includes a first delay locked loop (DLL) configured to generate the first clock signal, a second DLL configured to generate a second clock signal of the plurality of clock signals, wherein the first DLL and the plurality of staging flops are coupled to receive the second clock signal.

4. The integrated circuit as recited in claim 3, wherein the clock generation circuitry further includes a third DLL coupled to receive the second clock signal and configured to provide a third clock signal of the plurality of clock signals to a plurality of clock gating circuits, wherein the clock gating circuits are configured to provide each of a subset of the plurality of clock signals to correspondingly coupled ones of the plurality of clocked storage circuits.

5. The integrated circuit as recited in claim 1, further comprising a memory controller, wherein the delay circuit and the clock generation circuitry are implemented in the memory controller, and wherein the memory controller is configured to transmit the data and the first clock signal to a memory.

6. The integrated circuit as recited in claim 1, wherein the delay circuit is configured to apply delay to the data in increments of one half cycle of the first clock signal.

7. A method comprising:
   conveying a first clock signal from a memory controller to a memory;
   conveying data from the memory controller to the memory;
   aligning the data with the first clock signal at the memory, wherein aligning the data comprises delaying the data prior to conveying it to the memory, wherein delaying the data comprises routing each of a plurality of beats of data through corresponding selected ones of a plurality of pipelines, and wherein an amount of delay applied to each one of the plurality of beats of data is dependent on which of the plurality of pipelines through which it is routed;

wherein the method further comprises generating a plurality of clock signals including the first clock signal and providing each of a subset of the plurality of clock signals to correspondingly coupled ones of a plurality of clocked storage circuits, wherein each of the plurality of pipelines includes a subset of the plurality of clocked storage circuits.

8. The method as recited in claim 7, wherein said aligning further comprises adjusting a delay of the first clock signal provided by at least one delay locked loop (DLL).

9. The method as recited in claim 7, further comprising conducting a training procedure, wherein the training procedure comprises performing one or more writes to the memory, one or more corresponding reads from memory, and one or more corresponding adjustments to at least one of a DLL and delay applied to the data.

10. The method as recited in claim 7, further comprising receiving the data in a plurality of staging flops and routing the beats of the data from the staging flops into the corresponding selected ones of the plurality of pipelines.

11. The method as recited in claim 7, wherein delaying the data comprises applying delay to the data in increments of one half cycle of the first clock signal.

12. The method as recited in claim 7, wherein conveying the data comprises transmitting the data in beats, wherein each beat of data comprises a portion of a data word, and wherein transmitting in beats comprises selecting each of the pipelines to convey data to the memory in a predetermined sequence.

13. A system comprising:
a memory;
a memory controller coupled to the memory and configured to provide data and a first clock signal to the memory during writes thereto, wherein the memory controller is configured to write data words of N bits to the memory in M beats, wherein N and M are integer values, and wherein the memory controller includes:
a delay circuit, wherein the delay circuit includes M pipelines each including a subset of a plurality of clocked storage elements; and
a control circuit, wherein the control circuit is configured to adjust an alignment between data conveyed to the memory and the first clock signal by selectively routing each of the M beats through corresponding selected ones of a plurality of pipelines, and wherein the control circuit is further configured to select one of the M pipelines to convey one of the M beats to the memory per cycle of the first clock signal;

wherein the system further comprises a clock generation circuit configured to generate plurality of clock signals including the first clock signal, a second clock signal received by each of the plurality of staging flops, and a subset of clock signals each provided to correspondingly coupled ones of the plurality of clocked storage circuits.

14. The system as recited in claim 13, wherein the delay circuit further includes:
a plurality of staging flops;
M selection circuits coupled between the plurality of staging flops and the M pipelines, wherein the control circuit is configured to cause each of the plurality of selection circuits to select one of the plurality of staging flops to be coupled to a corresponding one of the M pipelines.

15. The system as recited in claim 13, wherein the clock generation circuit includes a delay locked loop (DLL) configured to generate the first clock signal by providing a delay to a received second clock signal, and wherein the control circuit is further configured to adjust the alignment between data conveyed to the memory and the first clock signal by adjusting a delay applied to the second clock signal.

16. The system as recited in claim 13, wherein the delay circuit is configured to delay the data in increments of one half cycle of the first clock signal.

\* \* \* \* \*